United States Patent [19]

Tabei

[11] 4,438,455

[45] Mar. 20, 1984

[54] SOLID-STATE COLOR IMAGER WITH THREE LAYER FOUR STORY STRUCTURE

[75] Inventor: Masatoshi Tabei, Kanagawa, Japan

[73] Assignee: Fuji Photo Film Co., Ltd., Kanagawa, Japan

[21] Appl. No.: 512,052

[22] Filed: Jul. 8, 1983

Related U.S. Application Data

[63] Continuation-in-part of Ser. No. 330,928, Dec. 15, 1981, abandoned.

[51] Int. Cl.³ ............................................. H04N 9/07
[52] U.S. Cl. ...................................... 358/44; 358/43
[58] Field of Search ...................... 358/41, 43, 44, 46, 358/47, 48; 250/211 J

[56] References Cited

U.S. PATENT DOCUMENTS

| | | | |
|---|---|---|---|
| 3,617,753 | 11/1971 | Kato | 358/44 |
| 3,971,065 | 7/1976 | Bayer | 358/41 |
| 3,984,721 | 10/1976 | Sato | 358/46 |
| 4,047,203 | 9/1977 | Dillon | 358/44 |
| 4,214,264 | 7/1980 | Hayward | 358/44 |
| 4,315,279 | 2/1982 | Kuwayama | 358/44 |

FOREIGN PATENT DOCUMENTS 916029 1/1963 United Kingdom ................. 358/48

Primary Examiner—Tommy P. Chin
Attorney, Agent, or Firm—Sughrue, Mion, Zinn, MacPeak & Seas

[57] ABSTRACT

A solid-state color imager comprised of a solid-state base comprised of a plurality of electrical switching elements arranged in sets of three having superimposed thereon a plurality of photosensor layers which can detect and absorb different colors of light. Each photosensitive layer is comprised of an upper transparent continuous electrode sublayer, a photoconductive sublayer, and a back mosaic electrode sublayer which is electrically connected to said base. When light strikes the outermost photosensitive layer, light of a particular color is absorbed, and in connection with said base, its presence is electrically detected and recorded. The unabsorbed light continues to travel and strike the next succeeding photosensor layer whereat another color of light is absorbed and detected. The unabsorbed light passing through the second photosensor layer strikes the innermost photosensor layer which detects the remaining light. The photosensor layers are electrically insulated from each other and the base and make possible detection of three separate colors of light such as blue, green and red without the use of multi-color filter arrays.

13 Claims, 8 Drawing Figures

SOLID-STATE COLOR IMAGER WITH THREE LAYER FOUR STORY STRUCTURE

RELATED APPLICATIONS

This application is a Continuation-In-Part application of my application entitled "Solid-State Color Imager With Three Layer Four Story Structure", Ser. No. 330,928 filed Dec. 15, 1981, now abandoned.

This application is also related to my two copending applications entitled "Solid-State Color Imager With Stripe or Mosaic Filters", Ser. No. 330,927, and "Solid-State Color Imager With Two Layer Three Story Structure", Ser. No. 330,921, and is being filed concurrently with a CIP application of the aforementioned "Solid-State Color Imager With Two Layer Three Story Structure" application Ser. No. 512,051.

FIELD OF THE INVENTION

The invention relates to solid-state color image sensors, and more particularly to a solid-state color image sensor which utilizes a plurality of photosensor layers superimposed over a solid-state base comprised of CCD, MOS, MNOS, or the like devices making it possible to eliminate the need for multi-color filters.

BACKGROUND OF THE INVENTION

A well-recognized goal within the field of solid-state color image sensors is the production of a solid-state color imager which is highly sensitive to light, and which produces a clear image while being inexpensive to manufacture. In pursuit of this goal, a number of different types of solid-state color imagers have been produced.

In one such imager, panchromatic image sensing elements in an array are selectively sensitized to color by means of an integral array of color filters disposed over the array of image sensing elements. Highly efficient configurations for such filter arrays maximize the amount of usable information based on human visual acuity for color detail and have been described for example in U.S. Pat. No. 3,971,065 issued July 20, 1976 to Bayer and U.S. Pat. No. 4,047,203 issued Sept. 6, 1977 to Dillon. However, the resolution capabilities inherent within such arrays are limited by the number of sensing elements that can be placed on the array and are further limited in that only a portion of each element in the array contributes to the resolution of fine detail. Consequently, the spatial resolution of such integral-filter color image sensing arrays, while optimized for the particular design, will not be as high as monochrome image sensing arrays of the same number of elements.

Another structure, proposed within British Pat. No. 2,029,642 and Japanese Patent Applications Nos. 55-39404, 55-277772, 55-277773, and 51-95720, is constructed such that the photosensor is superimposed on top of the information transfer device or solid-state base which is capable of a switching function. The base may be an MOS or CCD switching device. Such devices are described in detail within United Kingdom Pat. No. 2,029,642 the disclosure of which is incorporated herein by reference. Such structures have potentially high sensitivity due to a larger sensing area than is present within conventional imaging devices where the photosensor is located on the same level as the information transfer device. However, such devices must utilize multi-color filters and the loss of resolution is comparable to normal solid-state imagers as discussed above. In addition, to produce such a structure, the color filters must be arranged in a particular pattern on the image sensing element which creates difficulty in the alignment and bonding of the filters making the production of such devices complex and expensive.

Improvements over the structure disclosed in the aforementioned British Patent are described in European Pat. No. 46396 and Japanese Patent Application No. 56-133880. The improved structure in the European Patent uses three MOS elements on the solid-state base for each image sensing element. The photo-carrier generated in a photoconductive layer is applied to the gate of an amplifying MOS, as compared to the drain or source in the British Patent, which in turn is connected to a switching MOS transistor. The third MOS transistor provides a means for resetting the photoelectric conversion elements. Solid-state color imagers with this structure improve resolution and signal-to-noise ratios by preventing picture cells which are not being scanned from providing false signals.

The improved structure in the Japanese Patent Application No. 56-133880 uses Metal Nitride Oxide Silicon Semiconductor (MNOS) field effect transistors for detecting and storing data for photosignals, as electrical signals. Similarly to the European Patent described above, the photosignal is applied to the gate of the transistor. Solid-state color imagers with this structure give rise to a nonvolatile memory effect which results from use of the MNOS.

Both of the devices described in the European Patent and the Japanese Patent Application No. 56-133880 must still use multicolor filters arranged in a particular pattern on the image sensing element.

A technique for eliminating color filters in a vidicon is taught in U.S. Pat. No. 3,617,753 of Kato et al. The vidicon includes a conventional semiconductor layer having a substrate on a plurality of p-n diodes which store electrical signals representing light intensity. An electron beam scans the p-n diodes to provide video read out. By stepping the thickness of the semiconductor substrate through which the light passes to the p-n diodes, different wavelength light impinges on the p-n diodes, depending on the size of the step. In this manner different groups of p-n diodes can store different color light. Alternatively the p-n diodes can be formed at varying depths from the surface, thereby effectively stepping the thickness of the substrate. In another embodiment, solid state scanning can be provided instead of electron beam scanning. There a junction device and a MOS element is provided at each pixel and selective etching of the substrate results in varying distances between the light receiving surface of the semiconductor substrate and the junction device of the pixel. The apparatus disclosed is not planar due to the stepped or cutout arrangement and does not have the advantage provided by systems using photoconductors as the light responsive element.

A solid-state color image sensing array has been developed wherein the potential resolution is equal to that of a monochrome array of the same size. Such a sensing array has a plurality of superimposed channels (e.g., three superimposed channels for a three-color device) wherein each channel has a different spectral response due to differential absorption of light by a semiconductor material. (See Research Disclosure, August 1978, Vol. 172, Disclosure No. 17240 entitled: "Color Responsive CCD Imager" available from Industrial Opportunities, Ltd., Honeywell, Havant, Hampshire P091EF, U.K.) However, extremely complex and expensive processes are necessary to produce such devices due to the necessity of superimposing the three channels. When utilizing the CCD (charge-coupled device), the channels which carry the information signal must be carefully constructed within precise limitations making the construction complicated and expensive. Although it is possible to produce a single channel on a substrate, it is complicated and difficult to superimpose additional channels thereon.

Devices such as those described in Disclosure No. 17240 indicate that it is possible to produce multiple superimposed varied channels in silicon crystal which can act as multi-channel superimposed color-sensing devices. However, in addition to the expense and complication of their manufacture, as mentioned above, the color separation and selectivity of these devices is poor due to the inherent limitations of the materials used. The materials used in making such devices act as CCD channels which must have good single crystalline properties as well as color selective photosensors.

As mentioned above, there exists a need within the field for a solid-state color imager which is highly sensitive to light and which gives sharp, detailed resolution of the image. By utilizing a device wherein the multicolored filters are superimposed over the image-sensing elements in an array, the resulting image, as described within U.S. Pat. No. 3,971,065, has limited resolution capabilities, limited sensitivity and is complicated and expensive to produce due to the necessity of precisely placing the multi-color filters. Increased sensitivity can be obtained by utilizing a device wherein a photosensor is superimposed on top of the information transfer device, as described within United Kingdom Pat. No. 2,029,642, European Pat. No. 46396 and Japanese Application 56-133880. However, resolution of such devices is still somewhat limited because they require the use of multi-color integral filters which also increases the complexity and expense of their production. By utilizing a device having a sensing array of a plurality of superimposed channels, it is possible to obtain a resolution equal to that of a monochrome array. However, complex, expensive manufacturing techniques must be utilized to superimpose three channels on top of each other.

The present invention utilizes a plurality of photosensitive layers which are superimposed on each other and over the base thereby increasing sensitivity. Furthermore, the invention eliminates the need for multi-color integral filters since each photosensitive layer detects a different color of light. The device has a resolution equal to that of a monochrome array of the same size and can be produced by simple, conventional, inexpensive techiques.

SUMMARY OF THE INVENTION

The present invention provides a solid-state color imager which can be produced using simple, inexpensive conventional techniques such as conventional vacuum deposition or sputtering techniques. The device is highly sensitive to light and produces an image having a desirably high resolution considering the characteristics of the human eye. The light sensing area for each individual color element in the matrix can be up to three times that of a solid-state imager of the same size but having a single photoconductor layer and a multicolor filter. Also the image resolution is comparable to that of a conventional monochromatic solid state imager with the same number of elements.

The invention is comprised of a solid-state base for handling electrical charges and a plurality of photosensor layers superimposed on the base for detecting light. The solid-state base may be any type of two-dimensional information devices such as a Charge Couple Device (CCD), Metal Oxide Semiconductor (MOS) matrix switching device, or Metal Nitride Oxide Semiconductor (MNOS) matrix switching device, as distinguishable from the superposed channel information device. The photosensor layers which are superimposed on each other over the base are each comprised of three sublayers including an upper continuous transparent electrode layer, a mosaic pattern of back electrodes with a photoconductive sublayer positioned therebetween. The back electrodes on each of the layers are electrically connected with the solid-state base, e.g., gate, source or drain terminals depending on the type and arrangement of base sensing devices used. Each of the photosensor layers is electrically insulated from the other layer and from the solid-state base at all points other than via the electrical connections.

It is a primary object of this invention to present a solid-state color imager comprised of a solid-state base having a plurality of photosensor layers superimposed thereon such that each layer is electrically connected to the base which can read out electrical charges received from the photosensor, with each succeeding photosensor layer being sensitive to and absorbing a broader band of light.

Another object of the invention is to present a solid-state color imager which can be produced without the need for multicolor filters.

Still another object of the invention is to present a solid-state color imager which is highly sensitive to light.

Yet another object of this invention is to present a solid-state color imager which can produce an image with high resolution.

Another object of this invention is to present a solid-state color imager which can be produced in a simple and inexpensive manner.

These and other objects and advantages of the present invention will become apparent to those skilled in the art upon reading the details of construction and usage as more fully set forth below, reference being made to the accompanying drawings forming a part hereof wherein like numerals refer to like parts throughout.

DESCRIPTION OF THE PREFERRED EMBODIMENTS

Before the present solid-state color imager is described, it is to be understood that this invention is not limited to the particular arrangement of components shown, as such devices may vary. It is also to be understood that the terminology used herein is for purposes of describing particular embodiments, and is not intended to be limiting.

Figure 1:
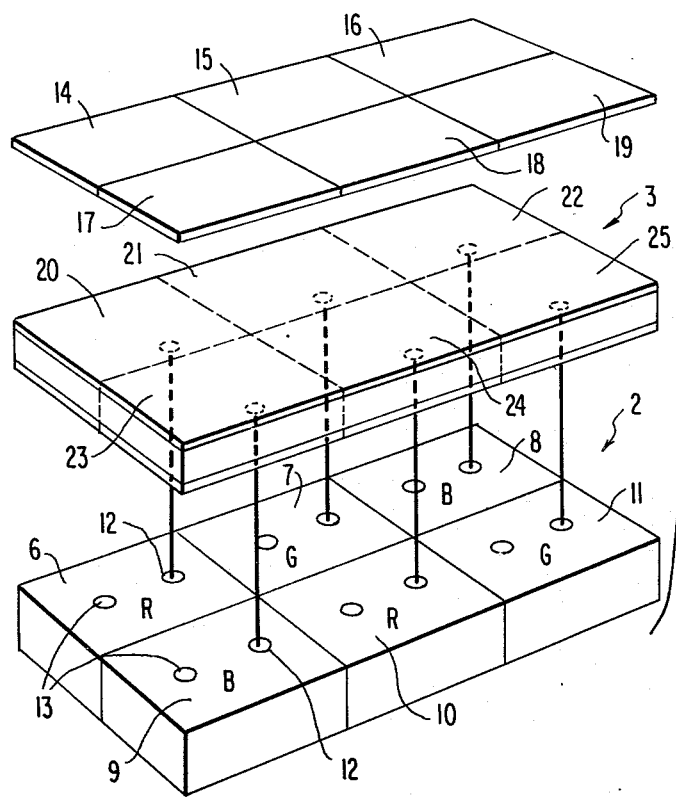
FIG. 1 is an exploded perspective view of a conventional solid-state color imager showing a photoconductive layer superimposed on a base.

Referring now to FIG. 1, a conventional solid-state color imager, of the type having a photosensitive element superimposed on the base can be described. FIG. 1 is an exploded perspective view of a conventional solid-state color imager. The base 2 has a photosensitive layer 3 superimposed thereon. The base 2 includes a plurality of MOS switching elements 6, 7, 8, 9, 10 and 11. FIG. 1 shows only a portion of what such an imager includes. In reality, the imager includes thousands of MOS elements. The elements 6, 7, 8, 9, 10 and 11 are utilized for various switching and transfer functions in connection with, for example, red, green, blue, blue, red and green light, respectively. Each of the elements 6–11 includes a source terminal 12 and drain terminal 13.

The photosensitive layer 3 is comprised of three sublayers which are described further below. The bottom sublayer or back mosaic electrodes on the bottom or innermost sublayer of the layer 3 are all electrically connected to elements 6–11. Superimposed over the photosensitive layer 3 are filter elements 14, 15, 16, 17, 18 and 19 which correspond respectively to elements 6, 7, 8, 9, 10 and 11. The filter elements 14–19 are utilized to filter out all light except a single color of light. Accordingly, for example, the filter 14 is utilized to filter out all light except red light; the filter 15 filters out all light except green light; and the filter 16 filters out all light except blue light, etc. in correspondence with the switching and transfer functions of elements 6–11 mentioned above.

Since the photosensing function within the layer 3 is separated from the switching and transfer function within the base 2, the device as shown within FIG. 1 is significantly more sensitive to light than prior art devices wherein the photosensing function was carried out at the same level as the switching and transfer functions. However, the device as shown within FIG. 1 still requires the use of the multi-color filters 14–19 and such filters require precise placement making the construction of the device somewhat expensive. The filters 14–19 are utilized to filter out light before it reaches the photosensitive areas 20, 21, 22, 23, 24 and 25 which are defined by their respective back electrodes.

The combination of each MOS element 6–11, photosensitive area 20–25 and filter 14–19 forms what are referred to in the art as pixels. Accordingly, the portion of the device as shown within FIG. 1 shows six pixels. Applicant's invention is capable of producing a device utilizing the same size base 2 which includes six pixels, or what is described below as two pixel sets, while eliminating the need for the multi-color filters.

Figure 2:
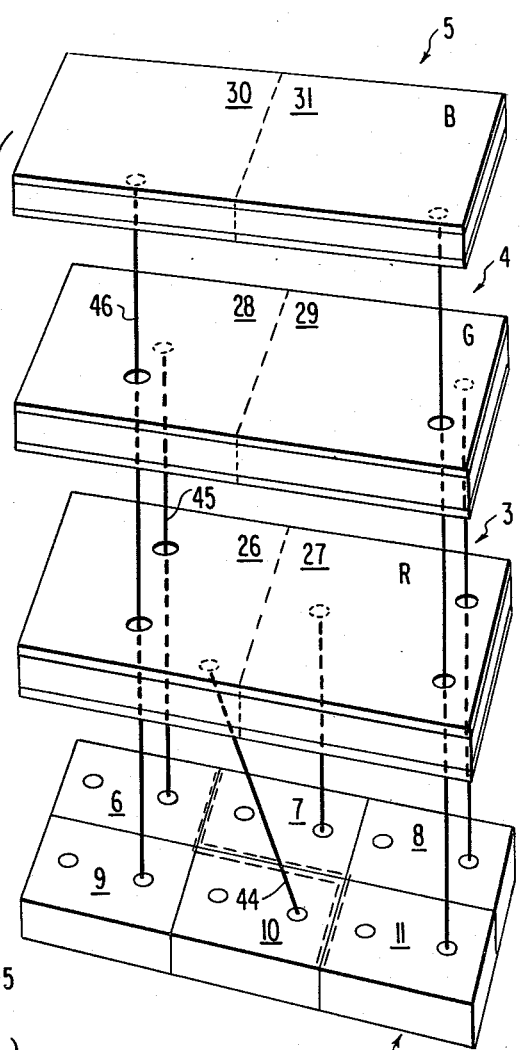
FIG. 2 is an exploded perspective view of the solid-state color imager of the present invention showing the three-layer, four-story construction.

Referring now to FIG. 2, wherein an exploded perspective view of the present invention is shown. The imager includes a base 2 having elements 6, 7, 8, 9, 10 and 11 positioned thereon. Each element may consist of one or more MOS, MNOS or the like devices. Photosensitive layers 3, 4 and 5 are superimposed on the base 2. Each of the layers 3, 4 and 5 is comprised of sublayers which are described in more detail with reference to FIG. 3. FIG. 2, like FIG. 1, shows only a small portion of the imager which is made up of thousands of similar portions.

Figure 3:
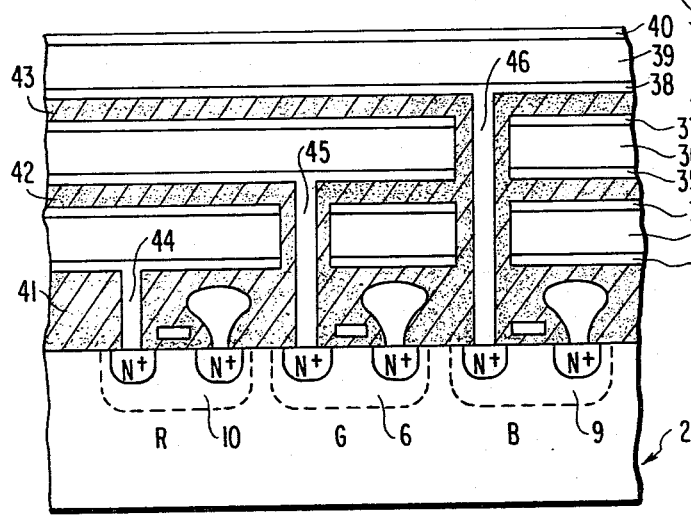
FIG. 3 is a longitudinal cross-sectional view of the solid-state color imager of the present invention.

The layer 3 includes photosensitive elements 26 and 27; layer 4 includes photosensitive elements 28 and 29; and the layer 5 includes photosensitive elements 30 and 31. Each of the elements 26–31 is connected to one of the elements of the base 2. The connection is made either to the gate, source or drain of one of the devices comprising the element, depending on the type and arrangement of the base elements. Figs. 2 and 3 illustrate connections made to the source or drain of a MOS transistor, as disclosed within British Pat. No. 2,029,642. However, if the elements are comprised of three MOS transistors, as disclosed in European Pat. No. 46396, or a single MNOS transistor, as disclosed in Japanese Patent Application No. 56-133880, then the connection is made to the gate of the amplifying MOS transistor or the gate of the MNOS transistor, respectively.

The elements 26, 28 and 30 are superimposed over each other as are elements 27, 29 and 31. Although it is easier to understand the present invention if the layers 3, 4 and 5 are described as consisting of photosensitive elements, 28, 29, etc., it should be understood that in each layer the top electrode sublayer and the photoconductive sublayer may be, and preferably are, continuous layers (except for the via holes). The bottom mosaic electrode sublayer is not continuous and it defines the metes and bounds of each photosensitive element.

The elements 26, 28 and 30 are connected respectively to elements 10, 6 and 9. The combination of elements 10, 6 and 9 with photosensitive elements 26, 28 and 30, comprise what is referred to as a pixel set. Two pixel sets are shown within FIG. 2. The elements are shown in FIG. 2 arranged in L-shaped patterns. However, it should be noted that the elements can be arranged in any number of different patterns, such as linearly, and connected to the back electrodes in a variety of different ways.

Referring now to FIG. 3, which is a longitudinal cross-sectional plan view of the imager of the invention, details of the layers 3, 4 and 5 can be given. As indicated above, each photosensitive layer 3–5 is comprised of three sublayers. The layer 3 includes sublayers 32, 33 and 34. The layer 4 includes sublayers 35, 36 and 37, and the layer 5 includes sublayers 38, 39 and 40. The layer 3 is insulated from the base 2 by insulation material layer 41. The layer 3 is insulated from the layer 4 by insulation material layer 42 and the layer 4 is insulated from the layer 5 by the insulation material layer 43. Accordingly, each of the layers 3–5 are insulated electrically from each other and from the base 2 at all points other than via the electrical connections 44, 45 and 46.

The photosensitive layer 3 includes a top transparent electrode sublayer 34 and a bottom opaque electrode sublayer 32. A sublayer 33 of a photoconductive material is positioned between the sublayers 32 and 34. The layers 4 and 5 include components similar to the layer 3. However, the bottom mosaic electrode sublayers 35 and 38 within layers 4 and 5 respectively must be transparent, unlike the opaque electrode sublayer 32 of the layer 3. Furthermore, each of the layers 3, 4 and 5 is constructed so as to be sensitive to and capable of absorbing different colors of light as described in detail in connection with FIGS. 5a–5c.

By producing a device in the manner as shown within FIGS. 2 and 3, it is possible to eliminate the need for an array of integral multi-color filters. More specifically, the present invention does not require the configurations of filter arrays such as are shown in FIG. 1 and are disclosed within U.S. Pat. Nos. 3,971,065 and 4,047,203. Since the device does not require integral (multi-color) color filters on top of the solid-state device, the present invention can be constructed in a relatively simple manner at a relatively low cost.

The present invention can operate without the need for any filters. However, it is possible to utilize a single broad band type filter superimposed over the outermost photosensitive layer 5. Such a filter can be designed to filter out light not visible to the human eye, such as light having a wavelength of less than 4000 Å or greater than 7700 Å, i.e., ultraviolet or infrared light.

Figure 4:
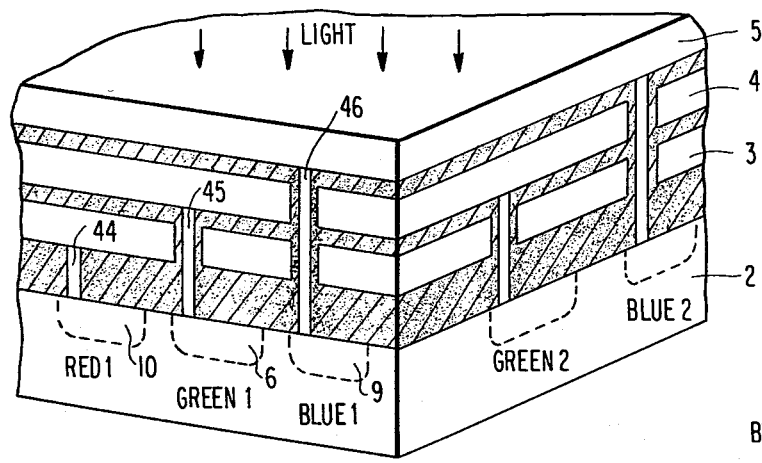
FIG. 4 is a schematic perspective view of the solid-state color imager of the present invention.

By referring now to FIG. 4, a perspective view of the imager of the present invention can be seen. As shown within FIG. 4, light strikes the top surface of the outermost layer 5. As described in detail below, some of the light is absorbed by layer 5 and the remainder of the light strikes the layer 4 where additional light is absorbed and the remaining light strikes the layer 3. The back electrode sublayer 32 of the layer 3 is opaque. Accordingly, no light strikes the base 2.

Figure 5:
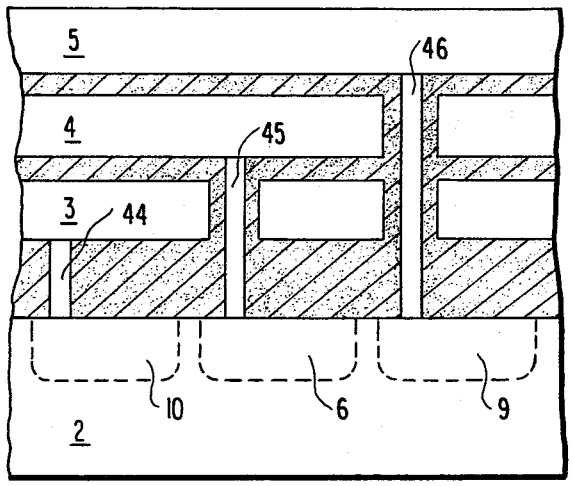
FIGS. 5, 5a, 5b and 5c are, respectively, a longitudinal cross-sectional view of the imager and graphs wherein the absorption versus wavelength has been plotted with respect to the light which is absorbed and sensed within the outermost, middle and innermost layers of the imager.
Figure 5A:
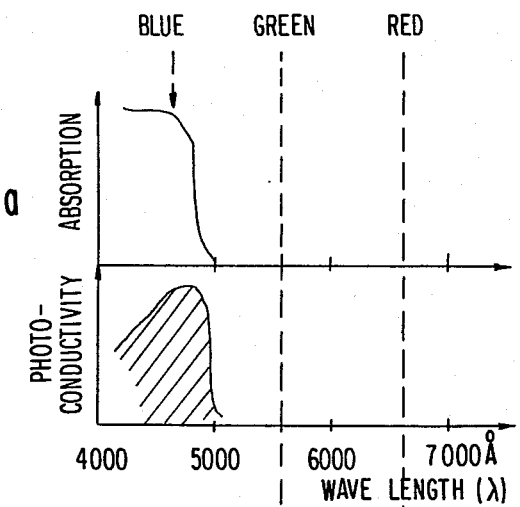
Figure 5B:
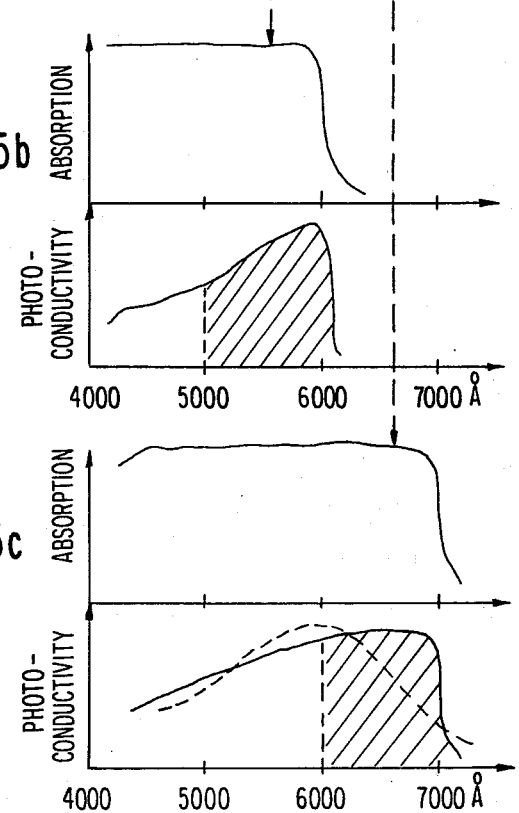
Figure 5C:
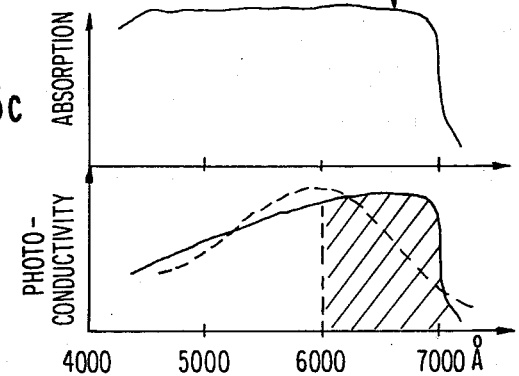

By referring to FIG. 5 in combination with FIGS. 5a–5c, the operation of the imager of the present invention can be described in detail. FIG. 5 is a longitudinal cross-sectional view of the device similar to that shown within FIG. 3, but showing less detail, e.g., the sublayers are not shown in FIG. 5. FIGS. 5a, 5b and 5c are graphs wherein both absorption and photoconductivity versus wavelength have been plotted with respect to light which is absorbed and sensed within layers 5, 4 and 3, respectively.

As light in the wavelength region to which the layer 5 is responsive strikes the layer 5, the resistance of the photoconductive sublayer 39, (see FIG. 3) at the particular element 30 (see FIG. 2) is reduced. The decreased resistance can be electrically detected and recorded by the utilization of the electrode sublayers 40 and 38 in connection with the element 9 within the base 2. The particular manner of recording the decrease in electrical resistance which is carried out in connection with the detection of light is not part of the present invention and is well known to those skilled in the art. The decreased resistance represents the intensity of blue light falling on the element 30 of the layer 5. (See FIG. 5a.) Furthermore, as shown by the absorption curve of FIG. 5a, the layer 5 absorbs light only in the blue region. Light which passes through the layer 5 only contains the green and red portions of the spectrum. The layer 5 absorbs all light having a wavelength of 5000 Å or less and allows the remainder of the light to pass through to layer 4. Furthermore, the layer 5 is sensitive to light having a wavelength of 5000 Å or less.

As light in the wavelength region to which the layer 4 is responsive, strikes the layer 4, the resistance of the photoconductive sublayer 36 (see FIG. 3) at element 28 (see FIG. 2), is reduced. The decreased resistance varies the current in the manner described above. Accordingly, green light falling on the region 28 can be detected in connection with the element 6. As shown by the absorption curve for the layer 4, it also absorbs light in the green region. The material within the layer 4 will actually absorb blue and green light, but the blue light has been absorbed or filtered out by the layer 5. Therefore, by the combination of layers 4 and 5, all the blue and green light have been filtered out and only red light passes through. The layer 4 filters out light having a wavelength of 6000 Å or less and is sensitive to light having a wavelength of 6000 Å or less. However, since light having a wavelength of 5000 Å or less has been filtered out by the layer 5, the layer 4 is only contacted by and therefore responsive to light having a wavelength of between 5000 and 6000 Å, i.e., green light.

As shown within FIG. 5c, the layer 3 absorbs all visible light and is somewhat sensitive to all visible light. However, the layer 3 is most sensitive to light in the red portion of the spectrum. As explained above, the layer 5 has already absorbed the blue light and the layer 4 has already absorbed the green light. Accordingly, only red light falls on layer 3. As the red light strikes the layer 3, the resistance of the photoconductive sublayer 33 (see FIG. 3) at the particular element 26 (see FIG. 2), is reduced. The decreased resistance varies the current in the manner described above allowing for the detection of the light by means of electrical impulses. Since the back electrode sublayer 32 (see FIG. 3) of the layer 3 is opaque, no light will strike the base 2. The back mosaic electrode sublayer 32 is the only opaque sublayer within any of the layers of the imager. All of the other sublayers are transparent, at least to light of the wavelength they are intended to pass to the next sublayer.

By utilizing the layers 3, 4 and 5, having the particular abilities of absorption and photoconductivity as explained above, it is possible to accurately perceive light striking any particular region of the imager and to determine the wavelength and thus color of the light striking that region. The intensity of the light striking each of the photosensitive elements can also be determined by the degree of change in resistance of the respective photosensitive layers. The layers 3, 4 and 5 are constructed so that small variations in resistance can be determined so that the relative intensity of the light of any particular wavelength (color) striking any particular element of the photosensitive layer can be detected and recorded via electronic means in connection with the base 2.

It is possible to construct the color imager disclosed herein in a variety of different embodiments. Although construction details are not shown, it will be apparent that the imager array can be constructed in the manner as shown within the above-referred British Patent, European Patent and Japanese Patent Application (No. 56-133880) with the variations necessary to accommodate three photoconductor layers plus openings therein for connecting the bottom electrodes of each photoconductive layer with the MOS or MNOS devices on the semiconductor substrate.

The embodiment shown within FIGS. 2, 3, 4 and 5, and explained in connection with FIGS. 5a–5c is considered to be the preferred embodiment of the invention. The upper layer 5 detects and absorbs blue light, the middle layer 4 detects and absorbs at least green light, and the bottom layer 3 detects at least red light and absorbs all light. By constructing the layers 4 and 5 such that they are capable of detecting and absorbing light, they act as both sensors and filters. Therefore, the need for the multi-color filters which must be arranged in an integral array, has been eliminated, while the ability of the device to detect different colors of light has been maintained.

The device as shown within FIG. 5 and described in connection with FIGS. 5a–5c can be constructed in different manners in order to obtain different end results. However, the embodiment as shown and described in connection with these Figures has been found to give desirable results. When constructing a device which is intended to operate in this manner, the insulating materials within the insulative layers as well as the material within each of the photosensitive layers must be constructed in a particular manner.

The insulative materials within layers 41, 42 and 43 may be comprised of a number of electrically insulative materials such as $SiO_2$, $Si_3N_4$, polyimide, polyamide, photoresist or other known organic polymers.

The uppermost photosensitive layer 5 is sensitive to blue light and may be comprised of a material selected from the group consisting of CdS, ZnCdS or ZnSeTe. The layer 4, which is sensitive to and absorbs both blue and green light, but which detects and absorbs only green light since the blue light has been filtered by the layer 5, may be constructed of amorphous selenium, CdSe, or GaAsP. The lower layer 3, is sensitive to blue, green and red light and absorbs all colors of light since the back mosaic electrode sublayer 32 is opaque. Furthermore, since blue and green light have been filtered by layers 4 and 5, the layer only detects red light. The layer 3 may be comprised of a material selected from the group consisting of GaAlAs, GaAsP, ZnCdTe, CdTe or amorphous silicon hydride.

Depending upon the particular type of photosensitive layers which are utilized, and the use to which the device is to be put, different amounts of voltage can be used in the operation of the device. Furthermore, different voltages can be utilized in connection with each of the photosensitive layers depending upon the particular results desired.

The present solid-state color imager has been disclosed and described herein in what is considered to be the most practical and preferred embodiments. The reference to particular materials, particular terminologies, and the particular sensitivities of the photosensitive layers to particular wavelengths and colors of light is done merely to disclose preferred embodiments. It is recognized, however, that departures may be made therefrom which are within the scope of the invention and that modifications will occur to one skilled in the art upon reading the description.

What is claimed is:

1. A solid-state color imager, comprising:
a solid-state base comprised of an array of electrical switching elements arranged on portions of said base in sets of three;
a first layer of insulation material positioned over said base;
a first photosensitive layer superimposed on said first layer of insulation material, said photosensitive layer being comprised of a top transparent electrode sublayer, a back mosaic electrode sublayer, and a photoconductive sublayer positioned between said top and back sublayers, said back mosaic electrode sublayer being segmented into an array of portions corresponding to said electrical switching elements on said base, and each segmented portion of said back mosaic electrode sublayer being electrically connected with one of said electrical switching elements from said sets of three elements on said base;
a second layer of insulation material positioned over said first photosensitive layer;
a second photosensitive sublayer superimposed over said second layer of insulation material, said second photosensitive sublayer being comprised of a top transparent electrode sublayer, a back transparent mosaic electrode sublayer, and a photoconductive sublayer positioned between said top and back sublayers, said back mosaic sublayer being segmented into an array of portions vertically corresponding to said portions of said first photosensitive layer, wherein each back mosaic electrode sublayer portion is electrically connected to one of said electrical switching elements from said sets of three on said base;
a third layer of insulation material positioned on said second photosensitive layer; and
a third photosensitive layer superimposed on said third layer of insulation material, said third photosensitive layer being comprised of a top transparent electrode sublayer, a back transparent mosaic electrode sublayer and a photoconductive sublayer positioned between said top and back sublayers, said back mosaic sublayers being segmented into an array of portions vertically corresponding to said portions in said second photosensitive layer, wherein said back mosaic sublayer portions are electrically connected to one of said electrical switching elements from said sets of three on said base, said first, second and third photosensitive layers being sensitive to and absorptive of different ranges of the visible wavelength spectrum, whereby electrical signals from said photosensitive layers represent light intensities of three different color ranges.

2. A solid-state color imager, comprising:
a solid-state base comprised of a plurality of electrical switching elements arranged in sets of three; and
three vertically positioned photosensitive layers superimposed on each other on said solid-state base, each of said photosensitive layers being comprised of a top transparent electrode sublayer, a back mosaic electrode sublayer and a photoconductive sublayer positioned between said top and back sublayers, each of said back mosaic sublayers being segmented into an array of portions wherein a back mosaic sublayer portion of each of said photosensitive layers is electrically connected to respective ones of said electrical switching elements, such that vertically positioned back mosaic sublayer portions on each of said three photosensitive layers are connected to a respective one of said electrical switching elements arranged in said sets of three, thus forming an array of pixel sets, said photosensitive layers being sensitive to and absorptive of different ranges of the visible wavelength spectrum, whereby electrical signals received from each of said photosensitive layers represent light intensities of three different color ranges.

3. A solid-state color imager, as claimed in any of claims 1 or 2, wherein said photosensitive layers are constructed and positioned in such a manner that each succeeding layer in the direction toward said solid-state base has an absorption versus wavelength characteristic resulting in the layer absorbing the broader band of the light spectrum.

4. A solid-state color imager, as claimed in claim 1, wherein said third photosensitive layer is sensitive to and absorbs light in the blue region of the spectrum, said second photosensitive layer is sensitive to and absorbs light at least in the green, but not the red, region of the spectrum, and said first photosensitive layer is sensitive to light at least in the red region of the spectrum.

5. A solid-state color imager, as claimed in claim 2, wherein each of said plurality of photosensitive layers is comprised of an outermost layer furtherest from said solid-state base which is sensitive to and absorbs light in the blue region of the spectrum, a middle layer which is sensitive to and absorbs light in at least the green, but not the red, region of the spectrum, and an innermost layer closest to said solid-state base, which is sensitive to light at least in the red region of the spectrum.

6. A solid-state color imager, as claimed in any of claims 1 or 2, wherein said electrical switching elements arranged on said base are metal oxide semiconductor devices.

7. A solid-state color imager, as claimed in claim 1, wherein said third photosensitive layer is comprised of a photosensitive material selected from the group consisting of CdS, ZnCdS, or ZnSeTe, said second photosensitive layer being comprised of a photosensitive material selected from the group consisting of amorphous selenium, CdSe or GaAsP, and said first photosensitive layer is comprised of a photosensitive material selected from the group consisting of GaAlAs, GaAsP, ZnCdTe, CdTe, or amorphous silicon hydride.

8. A solid state imager comprising:
a semiconductor switching matrix comprising a matrix of charge switching elements;
a first plurality of photoconductors responsive to and absorptive of light in a relatively low band of the visible spectrum, said first plurality of photoconductors being electrically connected, respectively, to a first plurality of said charge switching elements to deliver to said charge switching elements electrical signals representing the intensity of light which impinges thereon and to which said first plurality of photoconductors are sensitive;
a second plurality of photoconductors responsive to and absorptive of light in at least a higher band than said first plurality of photoconductors, said second plurality of photoconductors being electrically connected, respectively, to a second plurality of said charge switching elements to deliver to said charge switching elements electrical signals representing the intensity of light which impinges thereon and to which said second plurality of photoconductors are sensitive;
a third plurality of photoconductors responsive to light in at least a higher band than said second plurality of photoconductors, said third plurality of photoconductors being electrically connected, respectively, to a third plurality of said charge switching elements to deliver to said charge switching elements electrical signals representing the intensity of light which impinges thereon and to which said third plurality of photoconductors are sensitive;
said first, second and third plurality of photoconductors, constituting three superimposed layers of said imager, superimposed in an arrangement such that light impinging on said solid state imager falls first on said first plurality of photoconductors, the wavelengths of said light not absorbed thereby falls on said second plurality of photoconductors, and the wavelengths of light not absorbed thereby falling on said third plurality of photoconductors, whereby the signals switched by said first, second and third pluralities of charge switching elements represent, respectively, light intensities of three different bandwidths.

9. A solid-state imager as claimed in claim 8 wherein each of said first, second and third plurality of photoconductors comprises:
a photoconductor layer with top and bottom electrode layers, said bottom electrode layer being segmented, each segment defining one photoconductor of said plurality of photoconductors.

10. A solid-state imager, as claimed in any of claims 1 or 2, wherein said electrical switching elements arranged on said base are metal nitride oxide semiconductor devices.

11. A solid-state imager, as claimed in any of claims 1 or 2, wherein said electrical switching elements arranged on said base are comprised of a plurality of metal oxide semiconductor devices.

12. A solid-state imager, as claimed in any of claims 1 or 2 wherein said electrical switching elements arranged on said base are comprised of a plurality of metal nitride oxide semiconductor devices.

13. A solid-state imager, comprising:
a solid-state base comprising an array of at least first and second electrical switching means each having a control electrode and each providing an output signal in accordance with a signal at its control electrode;
a first photosensitive layer disposed over said base and sensitive to a first wavelength region of light and having a first output terminal for providing a first signal, said first output terminal being coupled to said control electrode of said first electrical switching means and said first photosensitive layer having an aperture therein; and
a second photosensitive layer overlying said first photosensitive layer and sensitive to a second wavelength region of light and having a second output terminal for providing a second signal, said second output terminal being coupled through said aperture to said control electrode of said second electrical switching means, whereby said second signal corresponds to the amount of light in said second wavelength region received by said second photosensitive layer and said first signal corresponds to the amount of light in said first wavelength region received by said first photosensitive layer through said second photosensitive layer.

* * * * * scribed in connection with these Figures has been found to give desirable results. When constructing a device which is intended to operate in this manner, the insulating materials within the insulative layers as well as the material within each of the photosensitive layers must be constructed in a particular manner.

The insulative materials within layers 41, 42 and 43 may be comprised of a number of electrically insulative materials such as $SiO_2$, $Si_3N_4$, polyimide, polyamide, photoresist or other known organic polymers.

The uppermost photosensitive layer 5 is sensitive to blue light and may be comprised of a material selected from the group consisting of CdS, ZnCdS or ZnSeTe. The layer 4, which is sensitive to and absorbs both blue and green light, but which detects and absorbs only green light since the blue light has been filtered by the layer 5, may be constructed of amorphous selenium, CdSe, or GaAsP. The lower layer 3, is sensitive to blue, green and red light and absorbs all colors of light since the back mosaic electrode sublayer 32 is opaque. Furthermore, since blue and green light have been filtered by layers 4 and 5, the layer only detects red light. The layer 3 may be comprised of a material selected from the group consisting of GaAlAs, GaAsP, ZnCdTe, CdTe or amorphous silicon hydride.

Depending upon the particular type of photosensitive layers which are utilized, and the use to which the device is to be put, different amounts of voltage can be used in the operation of the device. Furthermore, different voltages can be utilized in connection with each of the photosensitive layers depending upon the particular results desired.

The present solid-state color imager has been disclosed and described herein in what is considered to be the most practical and preferred embodiments. The reference to particular materials, particular terminologies, and the particular sensitivities of the photosensitive layers to particular wavelengths and colors of light is done merely to disclose preferred embodiments. It is recognized, however, that departures may be made therefrom which are within the scope of the invention and that modifications will occur to one skilled in the art upon reading the description.

What is claimed is:

1. A solid-state color imager, comprising:
   a solid-state base comprised of an array of electrical switching elements arranged on portions of said base in sets of three;
   a first layer of insulation material positioned over said base;
   a first photosensitive layer superimposed on said first layer of insulation material, said photosensitive layer being comprised of a top transparent electrode sublayer, a back mosaic electrode sublayer, and a photoconductive sublayer positioned between said top and back sublayers, said back mosaic electrode sublayer being segmented into an array of portions corresponding to said electrical switching elements on said base, and each segmented portion of said back mosaic electrode sublayer being electrically connected with one of said electrical switching elements from said sets of three elements on said base;
   a second layer of insulation material positioned over said first photosensitive layer;
   a second photosensitive sublayer superimposed over said second layer of insulation material, said second photosensitive sublayer being comprised of a top transparent electrode sublayer, a back transparent mosaic electrode sublayer, and a photoconductive sublayer positioned between said top and back sublayers, said back mosaic sublayer being segmented into an array of portions vertically corresponding to said portions of said first photosensitive layer, wherein each back mosaic electrode sublayer portion is electrically connected to one of said electrical switching elements from said sets of three on said base;
   a third layer of insulation material positioned on said second photosensitive layer; and
   a third photosensitive layer superimposed on said third layer of insulation material, said third photosensitive layer being comprised of a top transparent electrode sublayer, a back transparent mosaic electrode sublayer and a photoconductive sublayer positioned between said top and back sublayers, said back mosaic sublayers being segmented into an array of portions vertically corresponding to said portions in said second photosensitive layer, wherein said back mosaic sublayer portions are electrically connected to one of said electrical switching elements from said sets of three on said base, said first, second and third photosensitive layers being sensitive to and absorptive of different ranges of the visible wavelength spectrum, whereby electrical signals from said photosensitive layers represent light intensities of three different color ranges.

2. A solid-state color imager, comprising:
   a solid-state base comprised of a plurality of electrical switching elements arranged in sets of three; and
   three vertically positioned photosensitive layers superimposed on each other on said solid-state base, each of said photosensitive layers being comprised of a top transparent electrode sublayer, a back mosaic electrode sublayer and a photoconductive sublayer positioned between said top and back sublayers, each of said back mosaic sublayers being segmented into an array of portions wherein a back mosaic sublayer portion of each of said photosensitive layers is electrically connected to respective ones of said electrical switching elements, such that vertically positioned back mosaic sublayer portions on each of said three photosensitive layers are connected to a respective one of said electrical switching elements arranged in said sets of three, thus forming an array of pixel sets, said photosensitive layers being sensitive to and absorptive of different ranges of the visible wavelength spectrum, whereby electrical signals received from each of said photosensitive layers represent light intensities of three different color ranges.

3. A solid-state color imager, as claimed in any of claims 1 or 2, wherein said photosensitive layers are constructed and positioned in such a manner that each succeeding layer in the direction toward said solid-state base has an absorption versus wavelength characteristic resulting in the layer absorbing the broader band of the light spectrum.

4. A solid-state color imager, as claimed in claim 1, wherein said third photosensitive layer is sensitive to and absorbs light in the blue region of the spectrum, said second photosensitive layer is sensitive to and absorbs light at least in the green, but not the red, region of the spectrum, and said first photosensitive layer is sensitive to light at least in the red region of the spectrum.

5. A solid-state color imager, as claimed in claim 2, wherein each of said plurality of photosensitive layers is comprised of an outermost layer furtherest from said solid-state base which is sensitive to and absorbs light in the blue region of the spectrum, a middle layer which is sensitive to and absorbs light in at least the green, but not the red, region of the spectrum, and an innermost layer closest to said solid-state base, which is sensitive to light at least in the red region of the spectrum.

6. A solid-state color imager, as claimed in any of claims 1 or 2, wherein said electrical switching elements arranged on said base are metal oxide semiconductor devices.

7. A solid-state color imager, as claimed in claim 1, wherein said third photosensitive layer is comprised of a photosensitive material selected from the group consisting of CdS, ZnCdS, or ZnSeTe, said second photosensitive layer being comprised of a photosensitive material selected from the group consisting of amorphous selenium, CdSe or GaAsP, and said first photosensitive layer is comprised of a photosensitive material selected from the group consisting of GaAlAs, GaAsP, ZnCdTe, CdTe, or amorphous silicon hydride.

8. A solid state imager comprising:
a semiconductor switching matrix comprising a matrix of charge switching elements;
a first plurality of photoconductors responsive to and absorptive of light in a relatively low band of the visible spectrum, said first plurality of photoconductors being electrically connected, respectively, to a first plurality of said charge switching elements to deliver to said charge switching elements electrical signals representing the intensity of light which impinges thereon and to which said first plurality of photoconductors are sensitive;
a second plurality of photoconductors responsive to and absorptive of light in at least a higher band than said first plurality of photoconductors, said second plurality of photoconductors being electrically connected, respectively, to a second plurality of said charge switching elements to deliver to said charge switching elements electrical signals representing the intensity of light which impinges thereon and to which said second plurality of photoconductors are sensitive;
a third plurality of photoconductors responsive to light in at least a higher band than said second plurality of photoconductors, said third plurality of photoconductors being electrically connected, respectively, to a third plurality of said charge switching elements to deliver to said charge switching elements electrical signals representing the intensity of light which impinges thereon and to which said third plurality of photoconductors are sensitive;
said first, second and third plurality of photoconductors, constituting three superimposed layers of said imager, superimposed in an arrangement such that light impinging on said solid state imager falls first on said first plurality of photoconductors, the wavelengths of said light not absorbed thereby falls on said second plurality of photoconductors, and the wavelengths of light not absorbed thereby falling on said third plurality of photoconductors, whereby the signals switched by said first, second and third pluralities of charge switching elements represent, respectively, light intensities of three different bandwidths.

9. A solid-state imager as claimed in claim 8 wherein each of said first, second and third plurality of photoconductors comprises:
a photoconductor layer with top and bottom electrode layers, said bottom electrode layer being segmented, each segment defining one photoconductor of said plurality of photoconductors.

10. A solid-state imager, as claimed in any of claims 1 or 2, wherein said electrical switching elements arranged on said base are metal nitride oxide semiconductor devices.

11. A solid-state imager, as claimed in any of claims 1 or 2, wherein said electrical switching elements arranged on said base are comprised of a plurality of metal oxide semiconductor devices.

12. A solid-state imager, as claimed in any of claims 1 or 2 wherein said electrical switching elements arranged on said base are comprised of a plurality of metal nitride oxide semiconductor devices.

13. A solid-state imager, comprising:
a solid-state base comprising an array of at least first and second electrical switching means each having a control electrode and each providing an output signal in accordance with a signal at its control electrode;
a first photosensitive layer disposed over said base and sensitive to a first wavelength region of light and having a first output terminal for providing a first signal, said first output terminal being coupled to said control electrode of said first electrical switching means and said first photosensitive layer having an aperture therein; and
a second photosensitive layer overlying said first photosensitive layer and sensitive to a second wavelength region of light and having a second output terminal for providing a second signal, said second output terminal being coupled through said aperture to said control electrode of said second electrical switching means, whereby said second signal corresponds to the amount of light in said second wavelength region received by said second photosensitive layer and said first signal corresponds to the amount of light in said first wavelength region received by said first photosensitive layer through said second photosensitive layer.

* * * * *